(12) United States Patent
Ross et al.

(10) Patent No.: US 11,075,622 B1
(45) Date of Patent: Jul. 27, 2021

(54) SWITCH TURN ON IN A GATE DRIVER CIRCUIT

(71) Applicant: Allegro MicroSystems, LLC, Manchester, NH (US)

(72) Inventors: Thomas Ross, Livingston (GB); Michael Munroe, Londonderry, NH (US); James McIntosh, Longniddry (GB)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/112,172

(22) Filed: Dec. 4, 2020

Related U.S. Application Data

(63) Continuation-in-part of application No. 17/017,109, filed on Sep. 10, 2020.

(51) Int. Cl.
| | | |
|---|---|---|
| *H03K 3/00* | (2006.01) |
| *H03K 19/0175* | (2006.01) |
| *H03K 19/0185* | (2006.01) |
| *H02M 1/08* | (2006.01) |
| *H03K 17/042* | (2006.01) |

(52) U.S. Cl.
CPC ................................ *H03K 17/04206* (2013.01)

(58) Field of Classification Search
None
See application file for complete search history.

(56) References Cited

U.S. PATENT DOCUMENTS

| | | | | |
|---|---|---|---|---|
| 6,034,413 A | * | 3/2000 | Hastings | H01L 27/0623 257/197 |
| 6,256,215 B1 | * | 7/2001 | Barrett | H02M 7/538 363/132 |
| 6,559,689 B1 | | 5/2003 | Clark | |
| 6,781,423 B1 | * | 8/2004 | Knoedgen | H03K 17/063 327/110 |
| 7,649,325 B2 | | 1/2010 | McIntosh et al. | |
| 7,688,049 B2 | | 3/2010 | Iwabuchi et al. | |
| 7,719,325 B1 | | 5/2010 | Wang et al. | |
| 7,741,901 B2 | | 6/2010 | Lu et al. | |
| 7,889,002 B2 | * | 2/2011 | Berkhout | H03F 3/2171 330/251 |
| 8,461,881 B2 | | 6/2013 | Park | |
| 8,564,363 B1 | | 10/2013 | Wang | |

(Continued)

OTHER PUBLICATIONS

U.S. Notice of Allowance dated Apr. 7, 2021 for U.S. Appl. No. 17/017,109; 10 Pages.

(Continued)

*Primary Examiner* — Kenneth B Wells
(74) *Attorney, Agent, or Firm* — Daly, Crowley, Mofford & Durkee, LLP

(57) ABSTRACT

In one aspect, a gate driver circuit includes a gate driver having a first input connected to a first node and a second input connected to a second node. The gate driver circuit also includes a current source circuit that includes a first transistor and a capacitor having a top plate connected to the source of the first transistor and a bottom plate connected to ground. The gate driver circuit further includes a switch that includes a second transistor. A gate of the second transistor is connected to a drain of the first transistor and a source of the second transistor is connected to the first node.

23 Claims, 3 Drawing Sheets

(56) References Cited

U.S. PATENT DOCUMENTS

| | | | |
|---|---|---|---|
| 8,692,587 | B1 | 4/2014 | Dijk et al. |
| 8,791,723 | B2 * | 7/2014 | Mallikarjunaswamy ............... H01L 21/8234 327/108 |
| 9,214,884 | B2 | 12/2015 | Sonoda et al. |
| 9,294,084 | B1 | 3/2016 | McIntosh et al. |
| 9,571,093 | B2 | 2/2017 | Kinzer et al. |
| 9,859,883 | B2 | 1/2018 | Huang |
| 9,935,452 | B2 | 4/2018 | Looby et al. |
| 9,960,764 | B2 | 5/2018 | Kinzer et al. |
| 10,084,407 | B2 | 9/2018 | Looby et al. |
| 10,096,705 | B2 * | 10/2018 | Nielsen ............. H01L 21/761 |
| 10,122,274 | B2 | 11/2018 | Marini et al. |
| 10,277,224 | B2 * | 4/2019 | Chan ............. H03K 17/567 |
| 10,666,147 | B1 | 5/2020 | Ribarich et al. |
| 10,862,472 | B1 | 12/2020 | Zannoth et al. |
| 2019/0305547 | A1 | 10/2019 | Tran |

OTHER PUBLICATIONS

U.S. Appl. No. 16/819,765, filed Mar. 16, 2020, Lu.
U.S. Appl. No. 16/930,592, filed Jul. 16, 2020, Haselhuhn, Jr. et al.
U.S. Appl. No. 16/935,656, filed Jul. 22, 2020, Metivier et al.
U.S. Appl. No. 17/017,109, filed Sep. 10, 2020, Ross et al.

* cited by examiner

SWITCH TURN ON IN A GATE DRIVER CIRCUIT

BACKGROUND

Typically, a gate driver receives a low power input and produces a high-power output. Sometimes a gate driver is fabricated in an integrated circuit (IC) and formed in a n-type epitaxial structure of the IC that is on top of a p-type substrate. The interface between the n-type epitaxial structure and the p-type substrate forms a diode (p-n junction). Typically, this diode is not active; however, if the diode turns on, unwanted current becomes available that may destroy the gate driver and the IC.

SUMMARY

In one aspect, a gate driver circuit includes a gate driver having a first input connected to a first node and a second input connected to a second node. The gate driver circuit also includes a current source circuit that includes a first transistor and a capacitor having a top plate connected to the source of the first transistor and a bottom plate connected to ground. The gate driver circuit further includes a switch that includes a second transistor. A gate of the second transistor is connected to a drain of the first transistor and a source of the second transistor is connected to the first node.

In another aspect, an integrated circuit (IC) includes a gate driver having a first input connected to a first node and a second input connected to a second node. The IC also includes a current source circuit that includes a first transistor, a capacitor having a top plate connected to the source of the first transistor and a bottom plate connected to ground, and a static bias configured to provide a current to the gate of a second transistor. The IC further includes a switch that includes the second transistor. A gate of the second transistor is connected to a drain of the first transistor and a source of the second transistor is connected to the first node. The first transistor is a n-channel metal-oxide-semiconductor field-effect transistor (NMOS), and the second transistor is a p-channel metal-oxide-semiconductor field-effect transistor (PMOS).

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to improve a switch turn on in a gate driver isolating circuit. In one example, the techniques described herein can improve the turn on time for the switch from microseconds to nanoseconds.

Figure 1:
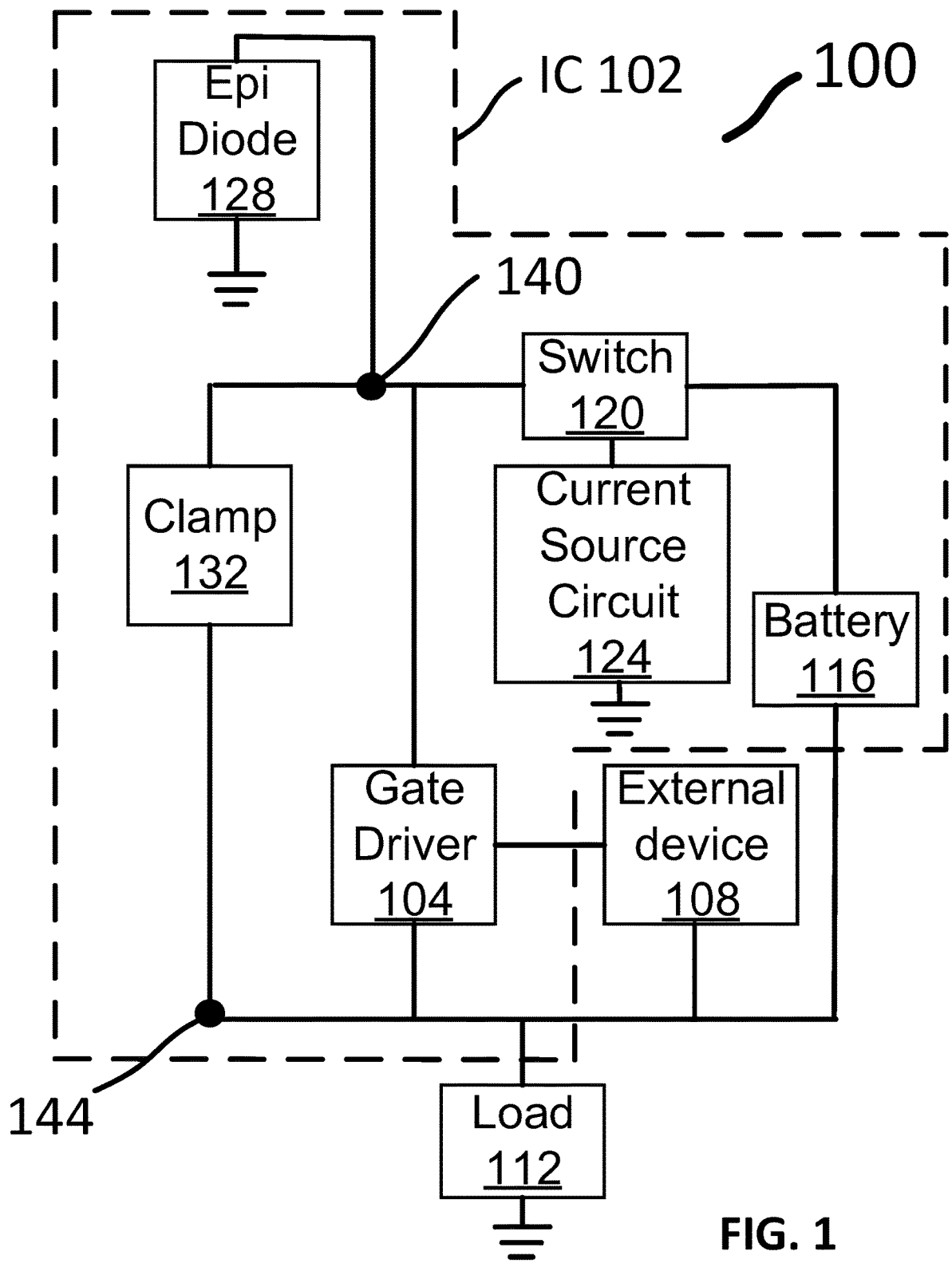
FIG. 1 is a block diagram of an example of a gate driver isolating circuit.

Referring to FIG. 1, an example of a gate driver isolating circuit is a gate driver isolating circuit 100. The circuit 100 includes an integrated circuit (IC) 102 connected to an external device 108, a load 112 and a battery 116.

The IC 102 includes a gate driver 104. The gate driver 104 has a first input connected to a first node 140 and a second node connected to a second node 144. The gate driver 104 has an output connected to the external device 108. A voltage VDP is the voltage at the first node 140 and a voltage VDM is the voltage at the second node 144. In one example, the gate driver 104 is fabricated in an n-epitaxial tub (not shown) of the IC 102.

The IC 102 also includes a switch 120 connected to the first node 140; a clamp 132 having a cathode connected to the first node 140 and an anode connected to the second node 144; and a current source circuit 124 connected to ground and to the switch 120 to power the switch 120. The battery 116 is connected to the switch 120 and to the second node 144.

The IC 102 further includes an epi diode 128, which has a cathode connected to the first node and an anode connected to substrate/ground. The epi diode 128 is formed during the manufacturing of the IC 102. For example, the epi diode 128 includes the n-type epitaxial tub and a p-type substrate (not shown) of the IC 102.

The external device 108 is connected to the second node 144. In one example, the external device 108 may be a transistor. In one particular example, the external device 108 may be an insulated-gate bipolar transistor (IGBT) or a metal oxide semiconductor field effect transistor (MOSFET).

The load 112 is connected to the second node 144 and to ground. In one example, the load 112 may be a coil. In one particular example, the load 112 may be a motor coil. In a further example, the load 112 may be another power transistor, which would then form a half-bridge configuration.

The gate driver 104 requires a non-zero voltage (|VDP−VDM|>0) to function, and this voltage is typically stored at the battery 116, which floats relative to the voltage VDM. The voltage VDM can have extreme negative transients depending on the load 112. This can have disastrous effects for the gate driver 104, because the voltage VDP at the first node 140 will also go negative by the same negative transients.

In one example, the gate driver 104 is a floating gate driver that has isolated components that can survive the negative transients on the second node 144 which brings down the voltage on the first node 140. In particular, these gate drive components are located between the first and second nodes 140, 144 so that the gate drive components between these two nodes 140, 144 are isolated from the p-type substrate by being in the n-type epitaxial tub, which is connected to the first node 140.

Problems arise when the negative transients start to bring the voltage VDP below ground. Since the gate driver 104 is fabricated in an n-epitaxial tub, which is only a diode voltage away from the p-substrate, if the voltage VDP goes negative (e.g., by more or less than 1 Volt), then the epi diode 128 turns on. However, the gate driver 104 will only survive negative transients up to a certain point, but beyond that point, substrate injection can interfere with the rest of the IC 102 and increased energy levels can be enough to destroy the IC 102. In order to protect the gate driver 104 from these negative transients, the switch 120 is placed in series between the epi diode 128 and the battery 116 to isolate the first node 140 and the gate driver 104 from the battery 116 to inhibit the epi diode 128 from turning on.

Figure 2:
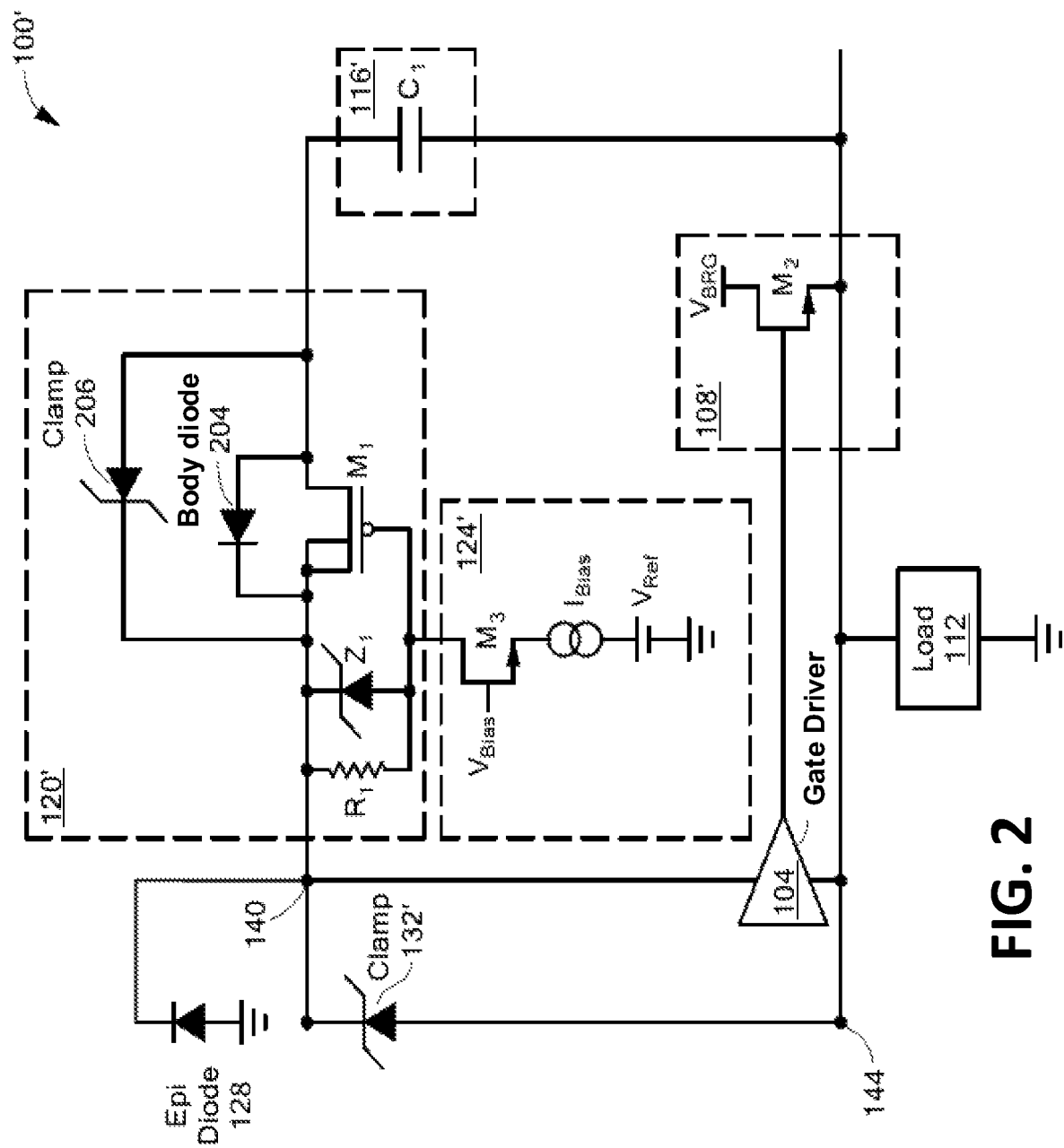
FIG. 2 is a circuit diagram of an example of the gate driver isolating circuit of FIG. 1.

Referring to FIG. 2, an example of the circuit 100 (FIG. 1) is a circuit 100'. An example of the battery 116 (FIG. 1) is a capacitor 116' or $C_1$. The capacitor $C_1$ is sometimes called a bootstrap capacitor.

An example of the external device 108 (FIG. 1) is an external device 108' or a transistor $M_2$. In one example, the transistor $M_2$ is an n-channel metal-oxide-semiconductor field-effect transistor (NMOS). A gate of the transistor $M_2$ is connected to the output of the gate driver 104. A drain of the transistor $M_2$ is connected to a voltage, $V_{BRG}$. A source of the transistor $M_2$ is connected to the second node 144.

An example of the switch 120 (FIG. 1) is a switch 120'. The switch 120' includes a transistor $M_1$. In one example, the transistor $M_1$ is a p-channel metal-oxide-semiconductor field-effect transistor (PMOS). A source of the transistor $M_1$ is connected to the first node 140 and a drain of the transistor $M_1$ is connected to the top plate of the capacitor 116'. The transistor $M_1$ includes a body diode 204 connecting the source and the drain of the $M_1$ transistor.

The switch 120' also includes a clamp 206, which is electrically parallel to the body diode 204. An anode of the clamp 206 is connected to the drain of the $M_1$ transistor and a cathode of the clamp 206 is connected to the source of the $M_1$ transistor. In one example, the clamp 206 is a Zener-activated clamp.

The switch 120' further includes a resistor $R_1$ and a Zener diode $Z_1$. The resistor R1 is connected to the gate of the transistor $M_1$ and to the source of the transistor $M_1$. An anode of the Zener diode $Z_1$ is connected to the gate of the transistor $M_1$ and a cathode of the Zener diode $Z_1$ is connected to the source of the transistor $M_1$. For example, current in the Zener diode $Z_1$ may develop a voltage across the transistor $M_1$, which turns on the transistor $M_1$. In one example, the Zener diode $Z_1$ may also be a number of diode-connected MOSFETs or any circuit device that develops a voltage across the gate-source of the transistor M1.

In one example, the switch 120' may be a low-voltage device which saves area when fabricated on the IC 102. In another example, the switch 120' may be a higher-voltage switch, which enhances immunity to negative transients.

An example of the current source circuit 124 (FIG. 1) is a current source circuit 124'. The current source circuit 124' includes a transistor $M_3$, a current source $I_{Bias}$ and a voltage source $V_{Ref}$. The current source $I_{Bias}$ is connected to a reference voltage source $V_{Ref}$, which is connected to ground. One of ordinary skill in the art would recognize that the current source $I_{Bias}$ is not an ideal current source but rather a current mirror or the like.

In one example, the transistor $M_3$ is an n-channel metal-oxide-semiconductor field-effect transistor (NMOS). A source of the transistor $M_3$ is connected to the current source $I_{Bias}$. A drain of the transistor $M_3$ is connected to the gate of the transistor $M_1$ and to the resistor $R_1$ and the Zener diode $Z_1$. A gate of the transistor $M_3$ is connected to a voltage source $V_{Bias}$.

An example of the clamp 132 (FIG. 1) is a clamp 132'. The clamp 132' has a cathode connected to the first node 140 and an anode connected to the second node 144. In one example, the clamp 206 is a Zener-activated clamp.

In this circuit 100', the transistor $M_1$ is in series with the first node 140 and the top plate of $C_1$. The top plate of $C_1$ does not have a direct connection to the epi diode 128 and is therefore isolated from the epi diode 128 at the node 140 and isolated from the p-substrate (not shown).

For negative transient events on the second node 144, the top plate of the capacitor $C_1$ follows and at a certain point, the transistor $M_1$ will act like a diode (i.e., the transistor $M_1$ turns off) and will not allow the voltage at the first node 140 to be dragged down with the top plate of the capacitor $C_1$. The gate driver 104 becomes isolated and the epi diode 128 will not turn on.

The current source, $I_{BIAS}$, places a Zener voltage (Z1) across the source-gate terminals of the transistor $M_1$ and turns the transistor $M_1$ on. The transistor $M_1$ is kept on as long as it has enough source-gate voltage. The switch 120' is open in response to the voltage VDP at the first node 140 being less than a threshold voltage $V_t$ of the switch 120' if these components are ground referenced and the voltage $V_{Ref}$ is equal to ground. Otherwise, as the voltage $V_{Ref}$ increases, then the turn-off voltage increases roughly with the value of the voltage $V_{Ref}$. Thus, if the voltage at the top plate of the capacitor $C_1$ goes below the sum of the threshold voltage $V_t$ and the voltage $V_{REF}$, then the transistor $M_1$ turns off.

In one example, the switch 120' is open in response to the voltage VDP at the first node 140 having a voltage which is a voltage difference between a voltage of the source of the transistor $M_1$ and a voltage of the gate of the transistor $M_1$ being less than the threshold voltage. In one particular example, the gate of the transistor $M_1$ cannot go lower than zero volts.

The resistor $R_1$ is a passive hold-off protection device. In one example, keeping the transistor $M_1$ on is beneficial as there is typically on an-chip regulator (not shown) that charges the top plate of the capacitor $C_1$ up relative to ground when the voltage VDM is held low.

When the transistor $M_2$ turns on, the voltage VDM at the second node 144 lifts to voltage $V_{BRG}$. If, for example, 10V was across the capacitor $C_1$, then the top plate of the capacitor $C_1$ lifts to $V_{BRG}$+10V. The voltage VDP at the first node 140 connects to the top plate of C1 through the low-impedance transistor $M_1$ such that the capacitor $C_1$ supplies the gate driver 104.

The switch 120' provides a number of benefits. In one example, as long as the epi diode 128 does not turn on, the capacitor $C_1$ is protected from being overcharged. An overcharged capacitor $C_1$ can damage the gate of the transistor $M_2$ and destroy the transistor $M_2$.

In another example, if the switch 120' were replaced with a diode instead that has an anode connected to top plate of $C_1$ and a cathode connected to the first node 140, then the voltage VDP at the first node 140 would lift with the capacitor $C_1$, but through the replacement diode, so there would be an excess power consumption.

Furthermore, this replacement diode would have to be a high-voltage diode, which typically has approximately 10% or more leakage to the substrate. However, there is reduced leakage to the substrate using the switch 120'.

Also, for low-going voltage edges on the second node 144 (that are not necessarily negative), the gate driver 104 would be pulled low, but through the clamp 132'. Every time this happens, the gate driver 104 is overstressed and consumes extra power. However, the solution of using the switch 120' instead of the replacement diode will remove these issues, because this solution now has a switch from the first node 140 to the top plate of the capacitor $C_1$, so that the gate driver 104 looks like a normal bootstrap-capacitor driven gate driver.

Thus, with the switch 120', when the voltage VDM goes below ground for specific load conditions (for example in a high-current integrated starter-generator system where there are very high currents), the voltage VDP follows the top plate of the capacitor $C_1$ but only down to a limit. When the top plate of the capacitor $C_1$ starts to approach ground, the transistor $M_1$ turns off because the PMOS does not have enough source-gate voltage to remain on.

The transistor $M_1$ is connected such that its body diode 204 isolates negative voltages on the top plate of the capacitor $C_1$ from the first node 140. The epi diode 128 will not go negative and will not inject to substrate. In a typical system without the addition of the switch 120', this will happen, and the epi diode 128 will only dissipate so much energy (related to the size of the epi tub) before device destruction occurs.

The voltage at which the transistor $M_1$ turns into a diode can be tuned depending on the value of the reference voltage $V_{Ref}$. The higher the reference voltage $V_{Ref}$ is, the higher the voltage at which the transistor $M_1$ turns into a diode.

Clamp 132' limits the voltage across the gate driver 104 and clamp 206 protects the transistor $M_1$ by protecting the drain-source voltage of the $M_1$ transistor. The Zener diode Z1 protects the gate-source of the M1 transistor as well as acting as a turn-on clamp for the M1 transistor. The epi diode 128 may turn on if the magnitude of the negative voltage on the second node 144 exceeds the lesser of (1) a sum of a breakdown voltage of the clamp 132' and a turn-on voltage of the epi diode 128 or (2) a sum of a breakdown voltage of the second clamp 206, the turn-on voltage of the epi diode 128 and a boot voltage of the capacitor $C_1$.

For example, if clamp 132' has a breakdown voltage of 20V and the epi diode 128 has a turn-on voltage of 1V, then the voltage VDM at the second node 144 can go 20V below ground before the voltage VDP at the first node 140 starts to go negative. At 21V below ground, the epi diode 128 turns on.

Depending on the boot voltage of the capacitor $C_1$ (which will normally be charged up), the breakdown voltage of the second clamp 206 provides extra headroom compared to a conventional system before the voltage VDP at the first node 140 starts to go negative.

For example, if a boot voltage of the capacitor $C_1$ is 12V, the breakdown voltage of the second clamp 206 is 6V and the turn-on voltage of the epi diode 128 is 1V, then a sum of a breakdown voltage of the second clamp 206, the turn-on voltage of the epi diode 128 and a boot voltage of the capacitor $C_1$ is 19V. Thus, 18V is how far below ground the voltage VDM at the second node 144 can go prior to the voltage VDP at the first node 140 going negative and at 19V below ground, the epi diode 128 turns on. This is a significant improvement over conventional systems where, in this example, the epi diode 128 would otherwise start injecting at 13V (sum of the turn on voltage of the epi diode 128 and the boot voltage of the capacitor $C_1$) below ground.

Figure 3:
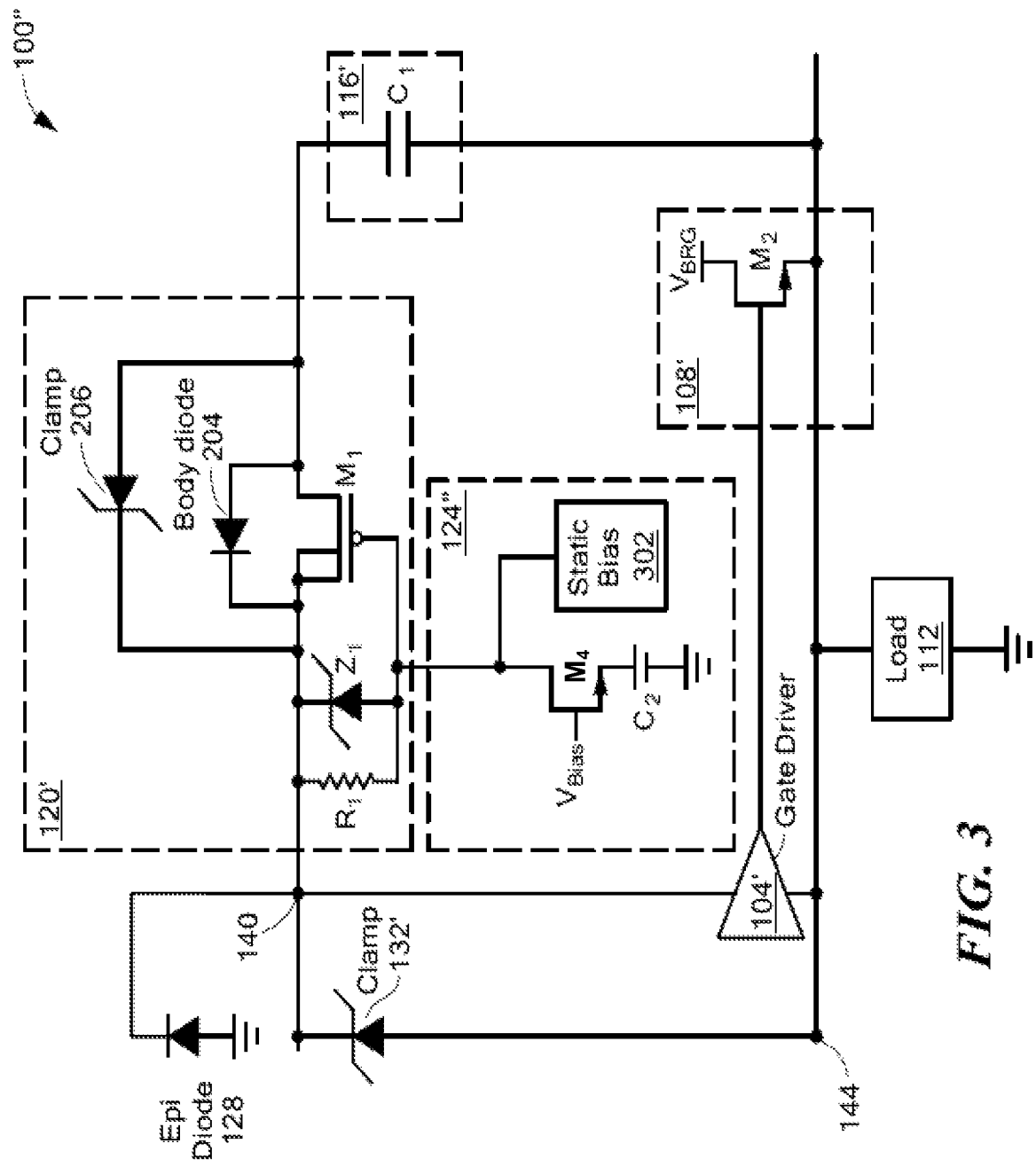
FIG. 3 is a circuit diagram of another example of the gate driver isolating circuit of FIG. 1.

Referring to FIG. 3, another example of the circuit 100 (FIG. 1) is a circuit 100''. The circuit 100'' is the same as circuit 100', except the current source circuit 124' is replaced with a current source circuit 124''.

The current source circuit 124'' includes a transistor $M_4$ having a gate connected to a voltage source $V_{Bias}$, a source connected to a top plate of a capacitor $C_2$, and a drain connected to the gate of the transistor $M_1$. In one example, the transistor $M_4$ is an n-channel metal-oxide-semiconductor field-effect transistor (NMOS).

The current source circuit 124'' also includes a static bias 302 connected to the gate of the transistor $M_1$. In one example, the static bias 302 provides a DC bias current.

The transistor $M_4$ and the capacitor $C_2$ act together as one total capacitor, which is activated only when needed. In one example, the transistor $M_4$ and the capacitor $C_2$ are similar to a voltage-triggered capacitor. The voltage on the top plate of the capacitor $C_2$ is equal to $V_{BIAS}$ minus a gate-source voltage of the transistor $M_4$ and is called herein a critical voltage, $V_{CRIT}$. As used herein, the voltage on the top plate of the capacitor $C_2$ is called $V_{C2}$.

In normal operation, a source-to-gate voltage of the transistor $M_1$ is approximately constant as the top plate of the capacitor $C_1$ moves up and down (note there may be a slight capacitive division between the intrinsic capacitances of the transistor $M_1$ and the drain capacitance of the transistor $M_4$). Assuming the transistor $M_1$ is acting as a perfect switch with a near zero voltage drop across it, then as the voltage of the top plate of $C_1$ falls, the source and the gate voltage of the transistor $M_1$ fall by the same amount. When the gate voltage of the transistor $M_1$ falls below the critical voltage $V_{CRIT}$, a capacitive division occurs between the transistor $M_1$ and the capacitor $C_2$ (assuming the transistor $M_4$ is low impedance such that time constants are minimal). This capacitive division is such that, below critical voltage $V_{CRIT}$, the gate voltage of $M_1$ is divided down instead of following the same magnitude drop as seen by the top plate of $C_1$.

For example, if the sum of the parasitic capacitance for the transistor $M_1$ (e.g., a gate-to-drain parasitic capacitance plus a gate-to-source parasitic capacitance plus a gate-to-bulk parasitic capacitance) is the same as the capacitance value of the capacitor $C_2$, then the gate voltage of the transistor $M_1$ (as the voltage $V_{C2}$ of the top plate of the capacitor $C_2$ passes below the critical voltage $V_{CRIT}$) is then equal to half of the voltage change seen on the capacitor $C_1$, as the voltage on the top plate of the capacitor $C_1$ continues dropping.

In one particular example, if the voltage source $V_{BIAS}$ is equal to 3V and the gate-to-source voltage of the transistor $M_4$ is equal to 1V, then the critical voltage $V_{CRIT}$ is equal to 2V. Assuming the clamp voltage of the Zener diode $Z_1$ is 5V and that the source-to-drain voltage drop of the transistor $M_1$ is negligible, then as the voltage at the top plate of the capacitor $C_1$ goes below 7V, the source-to-gate voltage of the transistor $M_1$ decreases. For example, as the top plate of $C_1$ goes from 7V to 6V, the source-to-gate voltage of the transistor $M_1$ is reduced by 0.5V (half of the 1V change at the top plate of the capacitor $C_1$) from 5V to 4.5V.

In some examples, the voltage source $V_{BIAS}$ can be a fixed voltage, self-generated from the source of the transistor $M_1$, or a combination of the two. In some examples, $V_{CRIT}$ is chosen such that the corresponding value on the top plate of $C_1$ meets the minimum requirement for an intended operating voltage of the device that is to be driven (e.g., the gate driver 104, which turns on and off the transistor $M_2$ into the load 112). The voltage on the capacitor $C_1$ should not go below the critical voltage $V_{CRIT}$+the source-to-gate voltage of the transistor $M_1$ (assuming negligible voltage drops due to the transistor M4 and the transistor M1 on-resistances). For example, if the critical voltage $V_{CRIT}$ is 2 Volts and the source-to-gate voltage of the transistor $M_1$ is 5 Volts, then C1 can go as low as 7V without the capacitor $C_2$ having any effect.

However, the transistor $M_4$ and the capacitor $C_2$ may affect the transistor $M_1$ when extreme negative transients, which pull the top plate of the capacitor $C_1$ low, are present. Under these conditions, the source-to-gate voltage of the transistor $M_1$ can drop to 0V, which is an issue when the capacitor $C_1$ rises again as it is desirable for the transistor M1 to turn on quickly (so that the transistor $M_1$ turns on as a low-impedance switch). The static bias 302 is not powerful enough to quickly turn on the transistor $M_1$. The top plate of $C_1$ can rise very quickly. The transistor $M_4$ and the capacitor $C_2$ provides a solution to turning the transistor M1 back on quickly.

As was previously described, when the voltage on the gate of the transistor $M_1$ goes below the critical voltage $V_{CRIT}$, the source-to-gate voltage of the transistor of $M_1$ starts to drop. This could be construed as not being an ideal situation, but if the sum of the critical voltage $V_{CRIT}$ and the source-to-gate voltage of the transistor of $M_1$ is set correctly, it should not interfere with circuit performance. Note that as the voltage on capacitor $C_1$ starts to rise again, the transistor $M_4$ and the capacitor $C_2$ circuit work to hold the voltage of the gate of the transistor $M_1$ down. So instead of the voltage of the gate of the transistor $M_1$ rising by the same voltage as the capacitor $C_1$, the voltage of the gate of the transistor $M_1$ may rise by half as much as voltage as the capacitor $C_1$, for example.

In general, the same capacitive division seen when the voltage of the drain of the transistor $M_1$ drops, is the same capacitive division seen when the voltage of the drain of the transistor $M_1$ rises. Thus, for example, neglecting the effects of the body diode 204 and using the same 0.5 factor as previously described, if the voltage of the drain of the transistor $M_1$ goes from 0 to 4V, the voltage of the gate of the transistor M1 moves from 0 to 2V.

At very low duty cycles, this capacitive turn-on determines the source-to-gate voltage of the transistor $M_1$. The static bias 302 is used to further charge the source-to-gate voltage of the transistor $M_1$ assuming a long enough switch on-time.

The circuit 100" provides one or more of the following advantages. For fast positive voltage transitions on the drain of the first transistor $M_1$, the first transistor $M_1$ naturally turns on quickly (at the same rate as the drain voltage moves) and without the need for complicated timing circuits, which might attempt to boost bias currents in order to turn on the gate of the first transistor $M_1$ voltage quickly, which can be power inefficient. Thus, it is possible to have the first transistor $M_1$ be a low impedance switch to connect its source and drain at various voltage levels and retain the low impedance connection for extreme positive transient voltage events on the drain terminal of the first transistor $M_1$. Also, as previously described herein, the first transistor $M_1$ protects the node 140 from negative voltage transitions from the capacitor $C_1$, for example. Upon the next positive edge, the first transistor $M_1$ turns back on quickly, providing a low-impedance connection to the circuit in preparation for the next negative voltage edge, which means the source of the first transistor $M_1$ follows the drain of the first transistor $M_1$ down, during drain negative voltage edges. If this were not the case, then some other additional circuit or additional clamp would be required to be added in order to drag the first node 140 down.

In other examples, the capacitor $C_2$ may be as large as possible. In one example, the capacitor $C_2$ is a capacitance multiplier. In one example, $C_2$ is about the same as $C_1$. In one particular example, $C_2$ is 100 pF.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A gate driver circuit comprising:
    a gate driver having a first input connected to a first node and a second input connected to a second node;
    a current source circuit comprising:
        a first transistor; and
        a capacitor having a top plate connected to the source of the first transistor and a bottom plate connected to ground; and
    a switch, wherein the switch comprises a second transistor, wherein a gate of the second transistor is connected to a drain of the first transistor, and a source of the second transistor is connected to the first node.

2. The gate driver circuit of claim 1, wherein the current source further comprises a static bias configured to provide a current to the gate of the second transistor.

3. The gate driver circuit of claim 1, wherein the first transistor is an n-channel metal-oxide-semiconductor field-effect transistor (NMOS).

4. The gate driver circuit of claim 1, further comprising an epi diode connected to the first node.

5. The gate driver circuit of claim 4, wherein the gate driver is fabricated in an n-type epitaxial layer.

6. The gate driver circuit of claim 5, wherein the epi diode comprises the n-type epitaxial layer and a p-type substrate.

7. The gate driver circuit of claim 4, wherein the capacitor is a first capacitor,
    wherein the gate driver circuit is configured to be connected to a second capacitor, wherein the second capacitor has a top plate connected to a drain of the second transistor and a bottom plate connected to the second node,
    and, with the switch being open, the epi diode is off in response to a magnitude of negative voltages on the second node not exceeding either (1) a sum of a breakdown voltage of the first clamp and a turn-on voltage of the epi diode, or (2) a sum of a breakdown voltage of the second clamp, the turn-on voltage of the epi diode and a boot voltage of the second capacitor.

8. The gate driver circuit of claim 1, further comprising a clamp connected to the first node and to the second node.

9. The gate driver circuit of claim 8, wherein the clamp is a Zener-activated clamp.

10. The gate driver circuit of claim 1, wherein the switch comprises a clamp connected to the first node and to the top plate of the second capacitor.

11. The gate driver circuit of claim 10, wherein the switch further comprises a Zener diode having an anode connected to a gate of the second transistor and a cathode connected to the first node.

12. The gate driver circuit of claim 11, wherein the switch further comprises a resistor having one end connected to the gate of the second transistor and the other end connected to the first node.

13. The gate driver circuit of claim 12, wherein the second transistor is a p-channel metal-oxide-semiconductor field-effect transistor (PMOS).

14. The gate driver circuit of claim 1, wherein an output of the gate driver is connected to an external device.

15. The gate driver circuit of claim 14, wherein the external device is a third transistor.

16. The gate driver circuit of claim 15, wherein the third transistor is an n-channel metal-oxide-semiconductor field-effect transistor (NMOS),
    wherein a gate of the NMOS is connected to the output of the gate driver, and
    and a source of the NMOS is connected to the second node.

17. The gate driver circuit of claim 1, wherein the second node is connected to a load.

18. The gate driver circuit of claim 17, wherein the load comprises a coil.

19. The gate driver circuit of claim 1, wherein the circuit is an integrated circuit.

20. The gate driver circuit of claim 1, the capacitor is a capacitance multiplier.

21. An integrated circuit (IC) comprising:
a gate driver having a first input connected to a first node and a second input connected to a second node;
a current source circuit comprising:
a first transistor;
a capacitor having a top plate connected to the source of the first transistor and a bottom plate connected to ground; and
a static bias configured to provide a current to the gate of a second transistor; and
a switch, wherein the switch comprises the second transistor, wherein a gate of the second transistor is connected to a drain of the first transistor, wherein a source of the second transistor is connected to the first node,
wherein the first transistor is an n-channel metal-oxide-semiconductor field-effect transistor (NMOS),
and the second transistor is a p-channel metal-oxide-semiconductor field-effect transistor (PMOS).

22. The IC of claim 21, wherein the switch further comprises:
a clamp connected to the first node and to the top plate of the second capacitor;
a Zener diode having an anode connected to the gate of the second transistor and a cathode connected to the first node; and
a resistor having one end connected to the gate of the second transistor and the other end connected to the first node.

23. The IC of claim 22, wherein the second node is connected to a load, and the load comprises a coil.

* * * * *

UNITED STATES PATENT AND TRADEMARK OFFICE
CERTIFICATE OF CORRECTION

PATENT NO. : 11,075,622 B1
APPLICATION NO. : 17/112172
DATED : July 27, 2021
INVENTOR(S) : Thomas Ross et al.

It is certified that error appears in the above-identified patent and that said Letters Patent is hereby corrected as shown below:

In the Specification

Column 2, Line 7, delete "node connected" and replace with --input connected--.

Column 3, Line 27, delete "R1" and replace with --$R_1$--.

Column 3, Line 36, delete "M1." and replace with --$M_1$.--.

Column 3, Line 59, delete "clamp 206" and replace with --clamp 132'--.

Column 4, Line 5, delete "(Z1)" and replace with --($Z_1$)--.

Column 4, Line 27, delete "on an-chip" and replace with --an on-chip--.

Column 5, Line 18, delete "Z1" and replace with --$Z_1$--.

Column 5, Line 18, delete "M1" and replace with --$M_1$--.

Column 5, Line 19, delete "M1" and replace with --$M_1$--.

Column 6, Line 56, delete "C1" and replace with --$C_1$--.

Column 6, Line 65, delete "M1" and replace with --$M_1$--.

Column 7, Line 2, delete "provides" and replace with --provide--.

Column 7, Line 2, delete "M1" and replace with --$M_1$--.

Signed and Sealed this
Twenty-second Day of November, 2022

Katherine Kelly Vidal
*Director of the United States Patent and Trademark Office*